United States Patent [19]

Murakami et al.

[11] Patent Number: 5,129,073
[45] Date of Patent: Jul. 7, 1992

[54] DYNAMIC RAM WITH READ-WRITE/REFRESH MODE JUDGING CAPABILITY

[75] Inventors: Yukichi Murakami; Keiichi Miyata, both of Nara, Japan

[73] Assignee: Sharp Kabushiki Kaisha, Japan

[21] Appl. No.: 759,640

[22] Filed: Sep. 12, 1991

Related U.S. Application Data

[63] Continuation of Ser. No. 534,332, Jun. 4, 1990, abandoned, which is a continuation of Ser. No. 309,039, Feb. 9, 1989, abandoned, which is a continuation of Ser. No. 128,464, Dec. 3, 1987, abandoned.

[30] Foreign Application Priority Data

Dec. 3, 1986 [JP] Japan .................. 61-288255

[51] Int. Cl.⁵ .................................. G06F 12/00
[52] U.S. Cl. ...................... 395/425; 364/246.91; 364/DIG. 1
[58] Field of Search ............. 395/400, 425, 725; 365/222

[56] References Cited

U.S. PATENT DOCUMENTS

| 4,368,515 | 1/1983 | Nielsen | 364/200 |
|---|---|---|---|
| 4,376,988 | 3/1983 | Ludwig et al. | 365/222 |
| 4,542,454 | 9/1985 | Brcich et al. | 364/200 |
| 4,549,284 | 10/1985 | Ikuzaki | 365/222 |
| 4,628,482 | 12/1986 | Tachiuchi et al. | 364/900 |
| 4,636,989 | 1/1987 | Ikuzaki | 365/222 |
| 4,701,843 | 10/1987 | Cohen | 364/200 |
| 4,710,903 | 12/1987 | Hereth et al. | 365/194 |

Primary Examiner—Kevin A. Kriess
Attorney, Agent, or Firm—Morrison & Foerster

[57] ABSTRACT

A dynamic random-access memory contains within itself a logical circuit which judges from an address signal received from an external system whether this external system is accessing the memory or not and, if the external system is found to be accessing it, the address specified by this address signal is selected but, if the external system is found not to be accessing it, an address outputted from an internally contained address counter is selected for refresh.

5 Claims, 7 Drawing Sheets

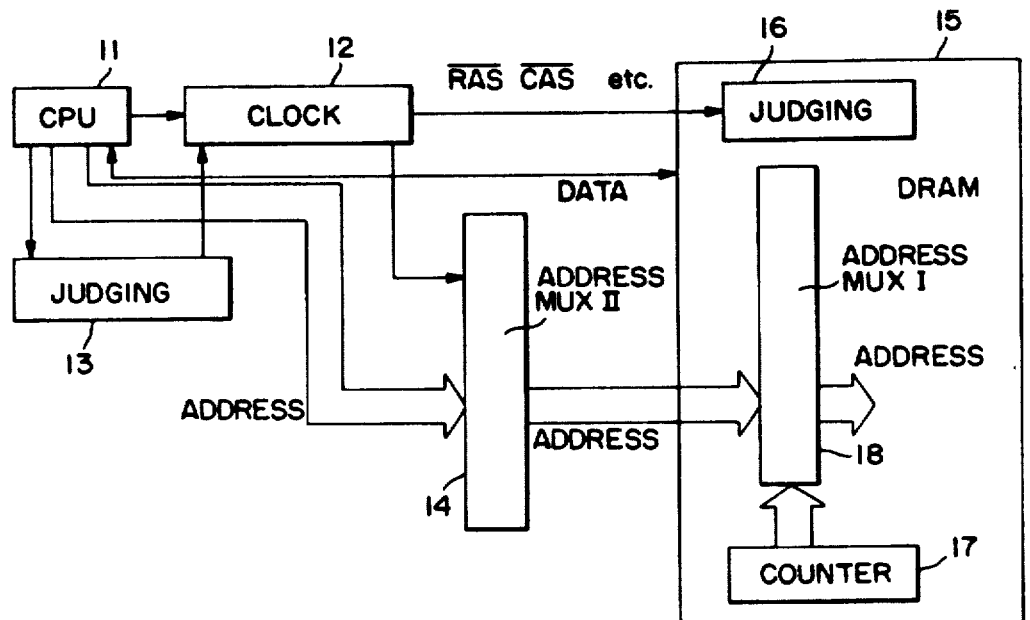
FIG. 5
(PRIOR ART)
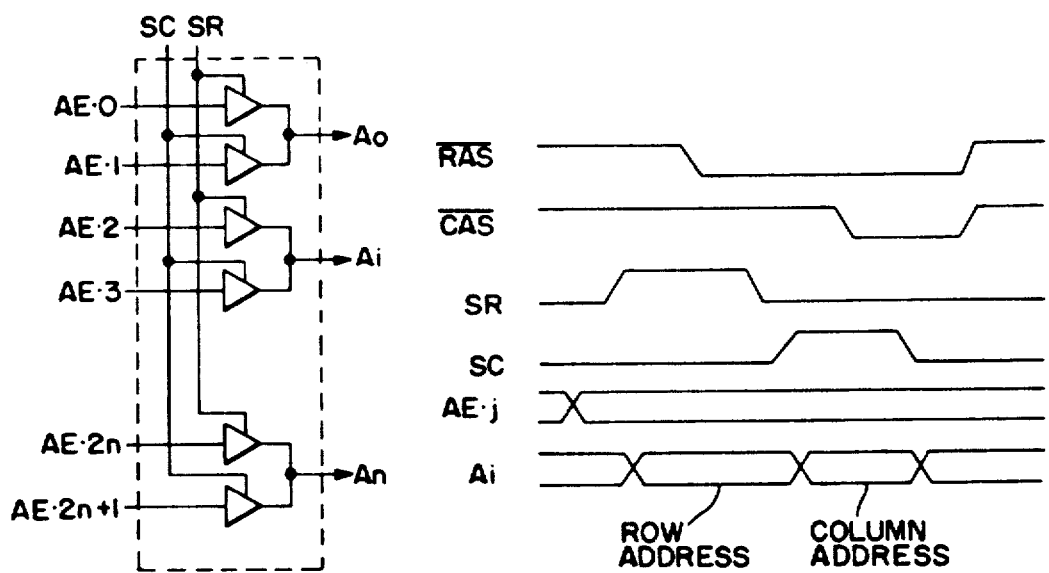
FIG. 11
FIG. 12

DYNAMIC RAM WITH READ-WRITE/REFRESH MODE JUDGING CAPABILITY

CROSS REFERENCES

This application is a continuation of earlier filed U.S. Application Ser. No. 07/534,332, file Jun. 4, 1990, which application is a continuation of earlier filed U.S. Application Ser. No. 07/309,039, filed Feb. 9, 1989 (now abanoded), which application is a continuation of earlier filed U.S. Application Ser. No. 07/128,464, filed Dec. 3, 1987 (now abandoned), which applications are incorporated herein by reference and to which applications we claim priority under 35 USC §120, and is based on Japanese application 61-288255, filed Dec. 3, 1986, which application is incorporated herein by reference and to which application we claim priority under 35 USC §119.

BACKGROUND OF THE INVENTION

This invention relates to a dynamic random-access memory (DRAM).

In general, a DRAM requires a refresh. A DRAM stores information in the form of charge, but the stored charge diminishes by a leak current, etc. Thus, it is necessary to periodically amplify the charge and to thereby rewrite the information in the memory cells. This operation is referred to as refresh. Two methods of refresh are generally used, the $\overline{RAS}$-only refresh and the $\overline{CAS}$-before-$\overline{RAS}$ refresh. RAS and CAS respectively indicate "row address strobe" and "column address strobe".

By the $\overline{RAS}$-only refresh method, the address of the row to be refreshed is specified, a normal input is made to a $\overline{RAS}$ input clock and a $\overline{CAS}$ input clock is aintained at the "H" level as shown by the timing chart of FIG. 2. As shown in FIG. 3, a system which uses the $\overline{RAS}$-only refresh method is so structured that an address counter for refresh (COUNTER) 4 for specifying a refresh address is necessarily disposed outside the DRAM 7 and the part of the system necessary for the control of the DRAM 7 becomes very complicated with a read-write/refresh mode judging circuit (hereinafter simply referred to as a judging circuit) 3, a clock generator circuit (CLOCK) 2, a first address multiplexer (MUX I) 5, a second address multiplexer (MUX II) 6 and the aforementioned address counter for refresh 4. The judging circuit 3 receives from a central processing unit (CPU) 1 a signal such as an address signal and judges on the basis of this signal whether the CPU 1 is accessing the DRAM 7 or not. This judging circuit 3 is also adapted to control the first address multiplexer 5, selecting the address received from the CPU 1 if the CPU 1 is found to be accessing the DRAM 7 and the address of the address counter for refresh 4 in other cases. It also controls the increment of the address counter for refresh 4, etc.

The clock generator circuit 2 is for generating clock signals such as the control signals $\overline{RAS}$, $\overline{CAS}$, etc. for the DRAM 7. The second address multiplexer 6 is used when row and column addresses are inputted by time division.

By the $\overline{CAS}$-before-$\overline{RAS}$ refresh method, on the other hand, the address of the row to be refreshed need not be specified from outside but its timing must be inputted as shown in FIG. 4 at the time of the refresh. By this method, there is no need for an outside address counter because the address counter for refresh is contained within the DRAM 7. A system using the $\overline{CAS}$-before-$\overline{RAS}$ refresh method is shown in FIG. 5. It can be seen that the outside system is simpler than that shown in FIG. 3 because the address counter for refresh 17 and the first address ultiplexer 18 in this case are contained within the DRAM 15. When the CPU 11 is not accessing the DRAM 15, however, the timing of the $\overline{CAS}$-before$\overline{RAS}$ shown in FIG. 4 must be provided from outside and the clock generator circuit 12 becomes structurally more complicated correspondingly. Moreover, a judging circuit 13 is required outside the DRAM 15, and another judging circuit 16 is required also inside the DRAM 15 for identifying the mode of operation when the timing shown in FIG. 4 is inputted. The second address multiplexer 14, as explained above by way of FIG. 3, is also for use when row and column addresses are inputted by time division.

SUMMARY OF THE INVENTION

It is an object of the present invention to provide a simplified system with a DRAM containing within itself the parts which are necessary for controlling it. The above and other objects of the present invention are achieved by providing a DRAM which contains within itself a logical circuit (or read-write/refresh mode judging circuit) for judging by an address signal supplied from an outside system whether or not it is being accessed by the outside system, an address counter for refresh and an address multiplexer adapted to selectively output, according to the output from the aforementioned logical circuit, an address at the time of an access from an outside system and an address from the aforementioned address counter for refresh at other times.

With a system thus structured, a complicated timing control such as $\overline{CAS}$-before$\overline{RAS}$ becomes unnecessary because the aforementioned read-write/refresh mode judging circuit can determine from an address received from outside whether the system is accessing the DRAM or not and its clock generator circuit need not be structurally complicated. Moreover, no read-write/refresh mode judging circuit is required outside.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings:

FIG. 5 is a schematic drawing of a system using a $\overline{CAS}$-before-$\overline{RAS}$ refresh, FIG. 11 is a schematic drawing showing the structure of the second address multiplexer of FIG. 1, FIG. 12 is a timing chart for the second address multiplexer of FIG. 11.

DETAILED DESCRIPTION OF THE INVENTION

Figure 1:
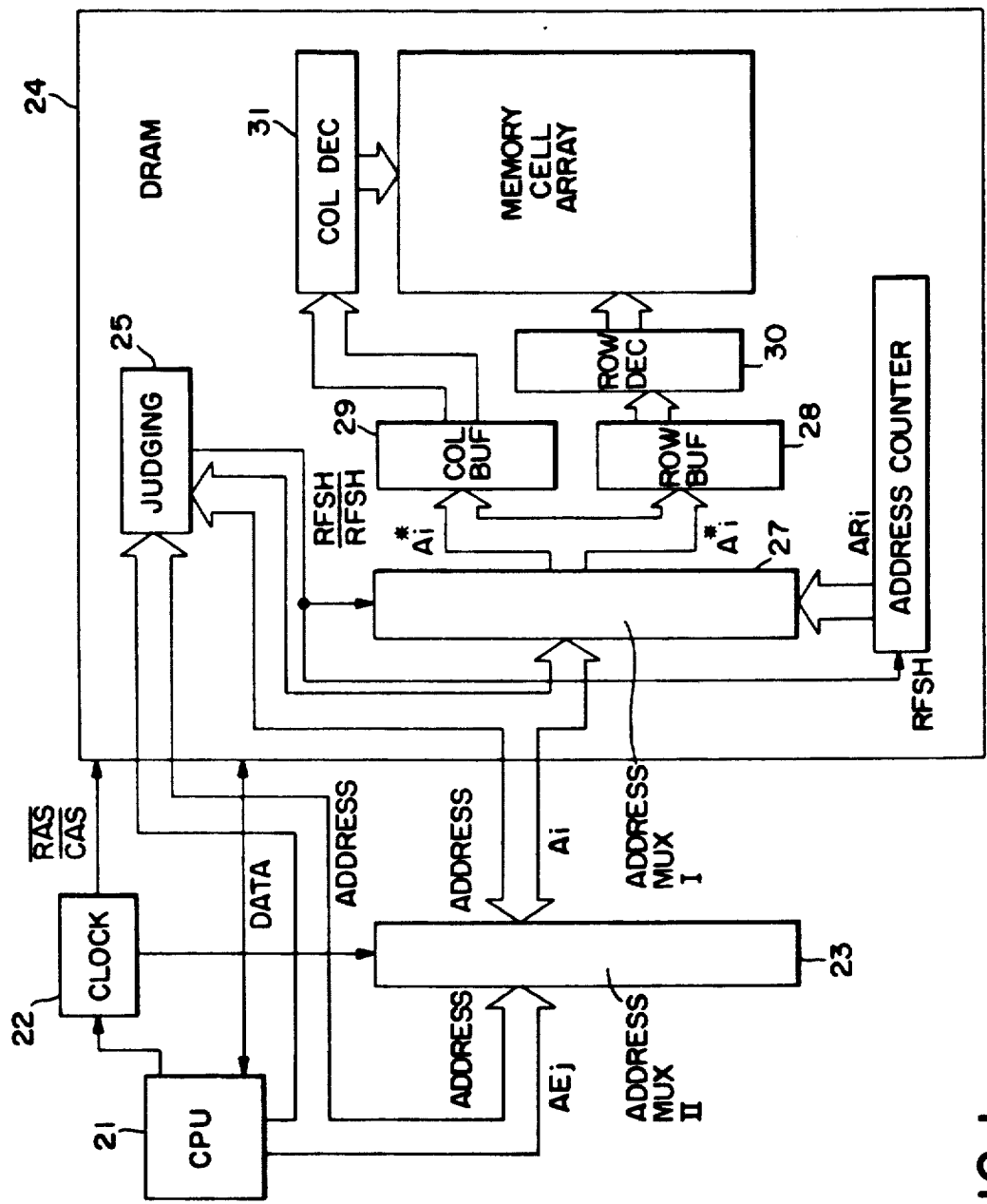
FIG. 1 is a schematic drawing of a system structure using a DRAM embodying the present invention.
Figure 2:
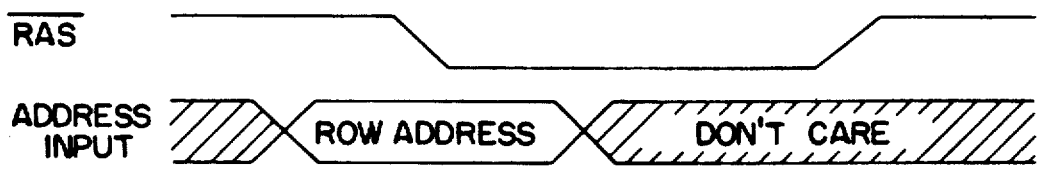
FIG. 2 is a timing chart for a $\overline{RAS}$-only refresh.
Figure 3:
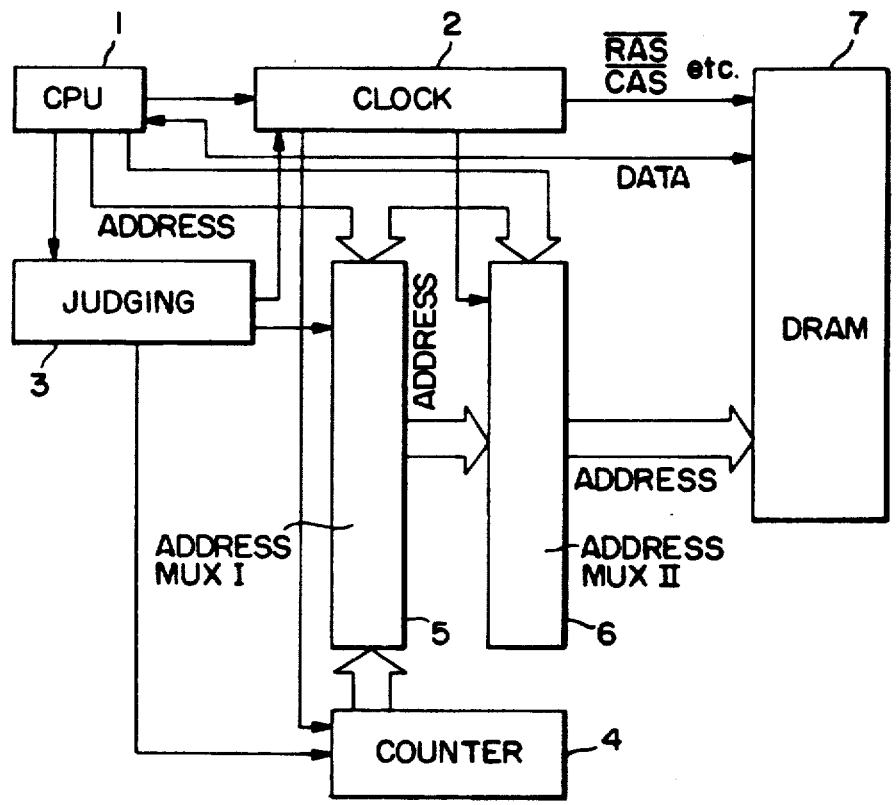
FIG. 3 is a schematic drawing of a system using a $\overline{RAS}$-only refresh.
Figure 4:
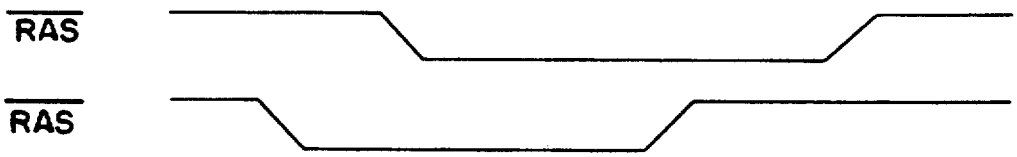
FIG. 4 is a timing chart for a $\overline{CAS}$-before-$\overline{RAS}$ refresh.

With reference to FIG. 1 which shows the structure of a system using a DRAM embodying the present invention, numeral 21 indicates a CPU, numeral 22 indicates a clock generating circuit, numeral 23 indicates a second address multiplexer for inputting row and column addresses by time division, numeral 24 indicates the DRAM, numeral 25 indicates a read-write/refresh mode judging circuit for judging by an address input from outside whether the CPU 21 is accessing the DRAM 24, numeral 26 indicates an address counter for refresh, numeral 27 indicates a first address multiplexer which is controlled by the output from the judging circuit 25 and is adapted to input the row and column addresses received from outside respectively to a row address buffer 28 and a column address buffer 29 at the time of an access and the address from the address counter for refresh 26 to the row address buffer 28 at the time of a refresh, numeral 30 indicates a row address decoder, numeral 31 indicates a column address decoder and numeral 32 indicates a memory cell array.

Figure 6:
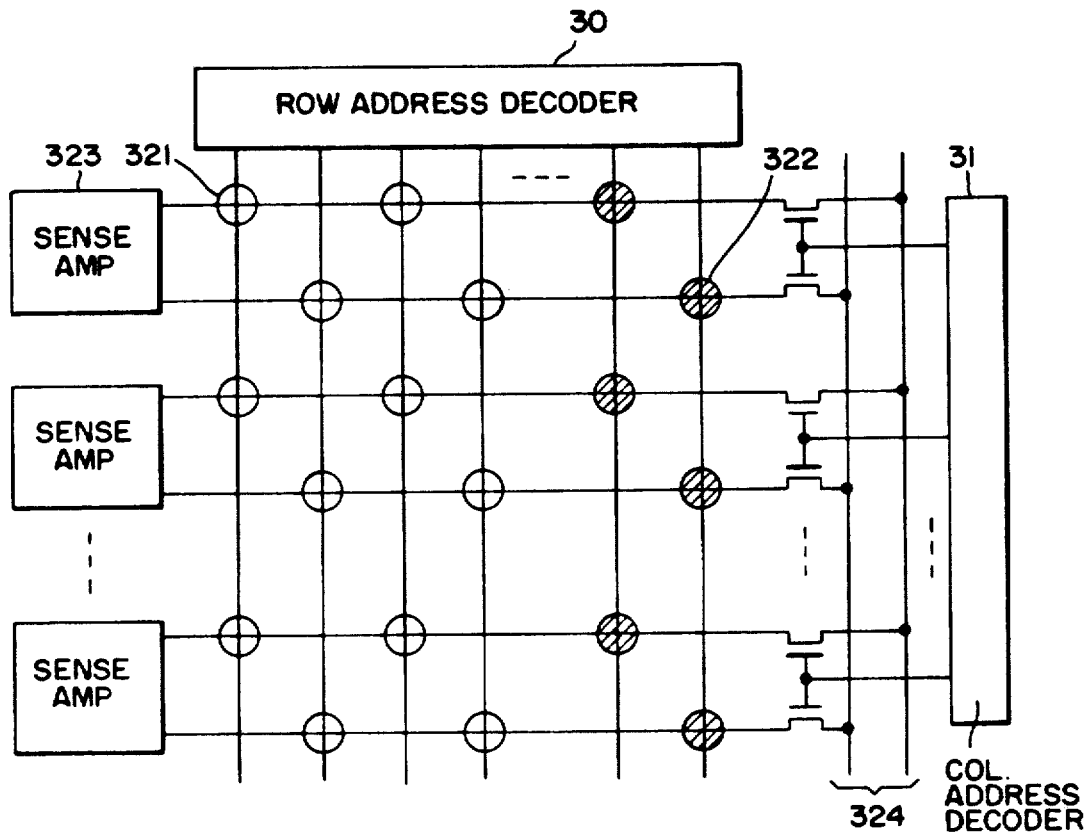
FIG. 6 is a schematic drawing showing the structure of a memory cell array in a DRAM.
Figure 6:
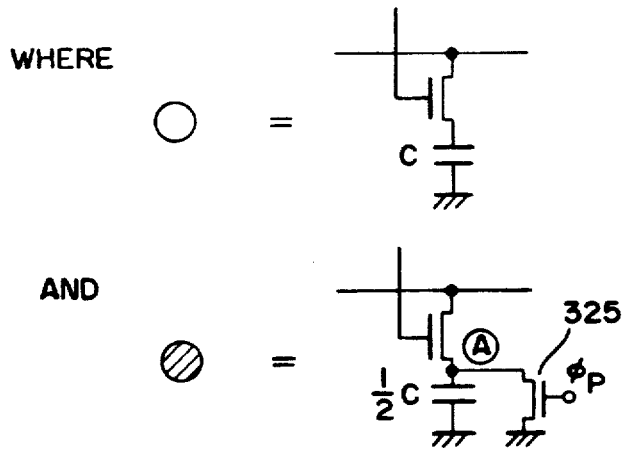

In FIG. 6 which shows the structure of the memory cell array 32, numeral 321 indicates a memory cell, numeral 322 indicates a dummy cell, numeral 323 indicates a sense amplifier, and numeral 324 indicates a data input-output line. Numeral 325 indicates a discharge transistor for a dummy cell 322. During a precharge period, this transistor 325 serves to bring the potential of the point A to the ground level.

Let us consider an example wherein the CPU 21 includes an address space of 16 binary digits such that an address may be expressed as $A_{E0}$-$A_{E15}$, $A_{E0}$ representing the lowest digit and $A_{E15}$ representing the highest digit. If the address is written in hexadecimal for convenience, the address space is 0000-FFFF. Let us assume now that the CPU 21 assigns adresses 6000-DFFF to the DRAM 24. This means that the CPU 21 writes in and reads from the DRAM 24 by specifying addresses in the range of 6000-DFFF and that the other addresses 0000-5FFF and E000-FFFF are used for an access to a program-storing read-only memory (ROM) or a refresh of the DRAM 24. In this situation, the highest three digits $A_{E13}$, $A_{E14}$ and $A_{E15}$ of the address alone determine as shown in Table 1 whether the system is in the read-write mode of operation or in the refresh mode of operation.

TABLE 1

| $A_{E15}$ | $A_{E14}$ | $A_{E13}$ | Mode | Corresponding hexadecimal address |
|---|---|---|---|---|
| L | L | L | Refresh | 0000-1FFF |
| L | L | H | " | 2000-3FFF |
| L | H | L | " | 4000-5FFF |
| L | H | H | Read-Write | 6000-7FFF |
| H | L | L | " | 8000-9FFF |
| H | L | H | " | A000-BFFF |
| H | H | L | " | C000-DFFF |
| H | H | H | Refresh | E000-FFFF |

Figure 7:
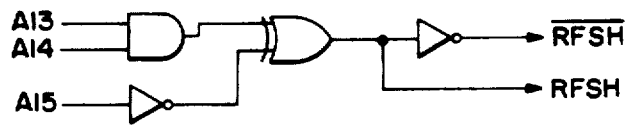
FIG. 7 is a schematic drawing showing the structure of the judging circuit of FIG. 1.

Thus, if the three highest address digits $A_{E13}$, $A_{E14}$ and $A_{E15}$ are used as the input and the read-write/refresh mode judging circuit shown in FIG. 7 is made a part of (or contained within) the DRAM, it becomes unnecessary to provide a separate judging circuit outside the DRAM. With reference to FIG. 7, the output RFSH is "L" and the output $\overline{RFSH}$ is "H" if the input address is 6000-DFFF and the outputs RFSH and $\overline{RFSH}$ are respectively "H" and "L" in other situations.

Figure 8:
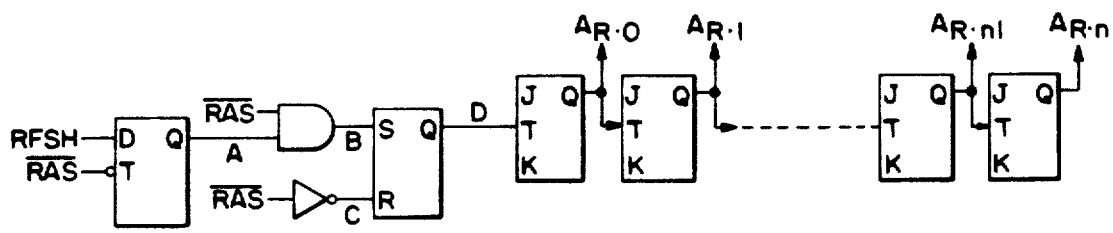
FIG. 8 is a schematic drawing showing the structure of the address counter for refresh shown in FIG. 1.
Figure 9:
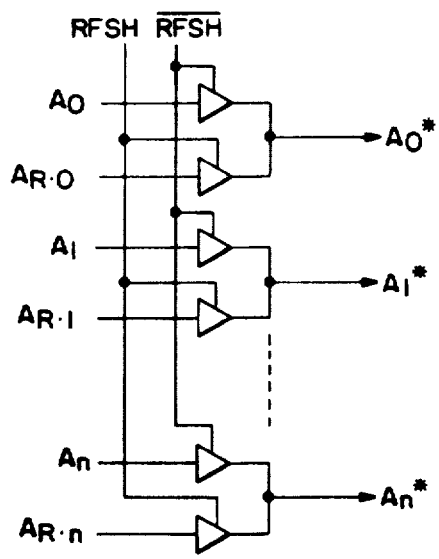
FIG. 9 is a schematic drawing showing the structure of the first address multiplexer of FIG. 1.
Figure 10:
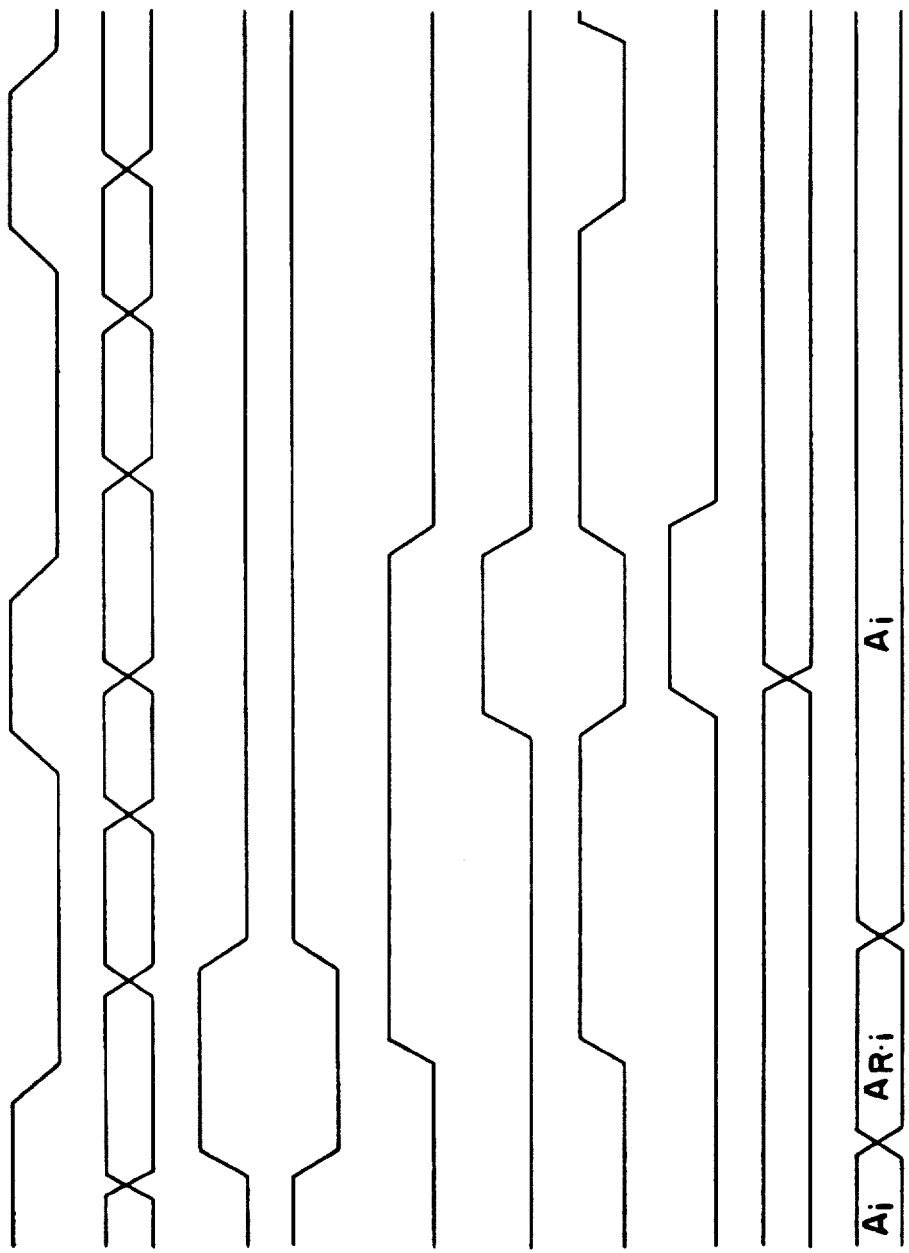
FIG. 10 is a timing chart for the counter of FIG. 8.

An example of address counter for refresh is shown in FIG. 8 and an example of first address multiplexer is shown in FIG. 9. The address counter for refresh of FIG. 8 is composed of flip-flops of the D-type, the RS-type, the JK-type, etc. and $A_{R0}$-$A_{Rn}$ represents its output. FIG. 10 is its timing chart. The first address multiplexer is controlled by RFSH and $\overline{RFSH}$ outputted from the judging circuit and selects outside addresses $A_i$ (i=0−n) and internally stored addresses $A_{Ri}$ (i=0−n).

The number of address digits which enter the second address multiplexer 23 depends on the capacity and the structure of the memory cell array 32. If the memory cell array 32 has 256 (=$2^8$) rows and 128 (=$2^7$) columns (such that the row and column address decoders 30 and 31 have 256 and 128 output lines, respectively), 8 row address lines enter the row address decoder 30 from the row address buffer 28 to select one of the 256 row addresses and 7 column address lines enter the column address decoder 31 from the column address buffer 29 to select one of the 128 column addresses. Since these row and column addresses are received by time division when they are entered from outside, as explained above, the address signal $A_i^*$ of FIG. 1 contains 8 digits, $A_0^*$ through $A_6^*$ going to both the row and column buffers 28 and 29 and $A_7^*$ only to the row address buffer 28. Similarly, address $A_j$ includes 8 digits. Of the 16 digits of the output from the CPU 21, 15 (=8+7) digits of $A_{Ej}$ ($A_{E0}$ through $A_{E14}$) are received by the second multiplexer 23.

When the memory cell array 32 is freshed, all memory cells connected to one of the output lines from the row address decoder 30 is refreshed, there being no need to select any of the 128 output lines of the column address decoder. To select one of the row addresses, use may be made either of the external address $A_i$ or of an output $A_{Ri}$ from the internal address counter for refresh 26. In this example, therefore, n shown in FIG. 8 is 7.

An example of the structure of second address multiplexer is shown in FIG. 11 and its timing chart in FIG. 12. In these figures, $A_{Ej}$ (j=0−2n+1) represent addresses received from h CPL and SR and SC represent row and column address selection signals, respectively. Row and column addresses are outputted by time division as shown by the row and column address selection signals SR and SC.

Figure 13:
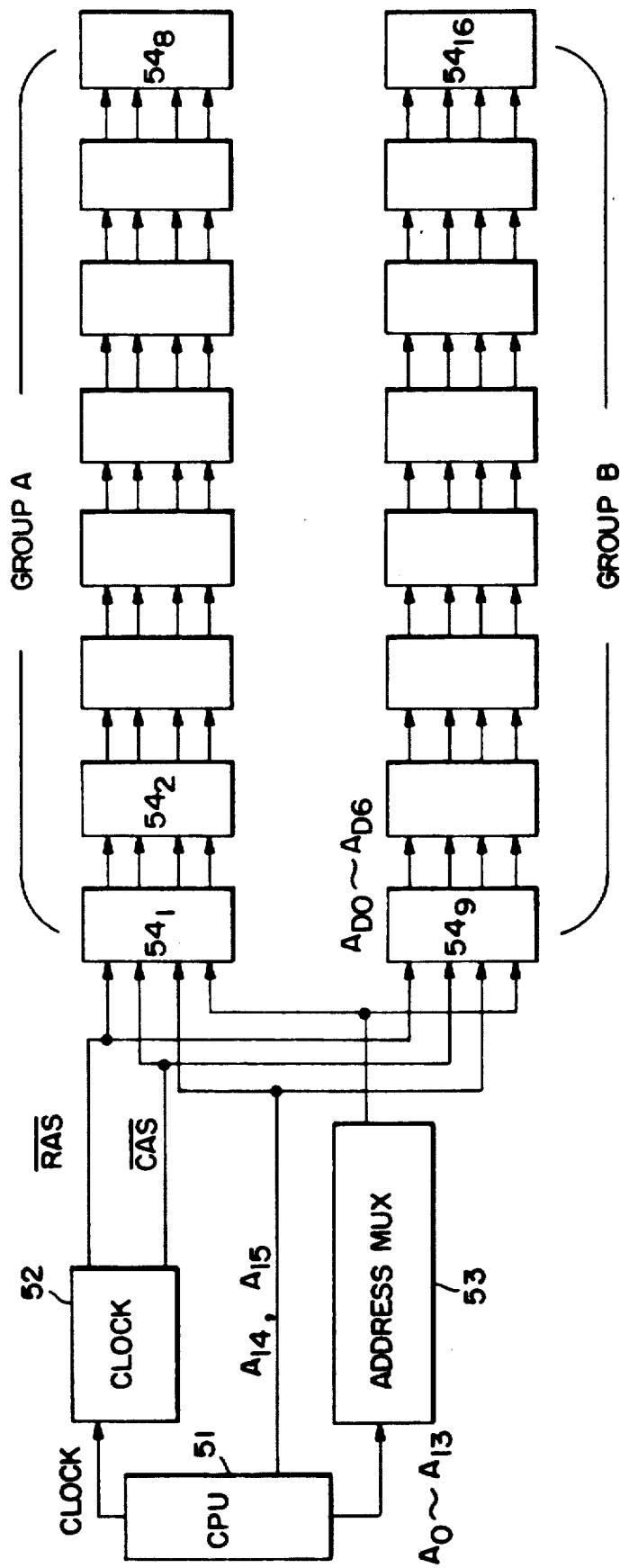
FIG. 13 is a schematic drawing of a system using 16 DRAMs embodying the present invention.

Let us next consider a system with an 8-bit CPU having an address space of 16 binary digits and controlling 16 DRAMs of 16K × 1-bit structure embodying the present invention. Let us further assume that the 16 DRAMs are divided into Groups A and B each containing 8 DRAMs and the addresses 0000-3FFF are assigned to Group A, 4000-7FFF to Group B and 8000-FFFF to a ROM and other peripherals. In this case, the DRAMs must receive not only a multiplexed address input but also an address input $A_{14}$-$A_{15}$ directly from the CPU. In other words, if the input address is between 0000 and 3FFF, for example, the DRAMs of Group B can judge from $A_{14}$ and $A_{15}$ that they are not being selected and a refresh is processed on them. In FIG. 13 which shows the structure of such a system, numeral 51 indicates the CPU, numeral 52 indicates a clock generator circuit, numeral 53 indicates an address multiplexer and numerals $54_1$-$54_{16}$ indicate the DRAMs.

In summary, the embodiments of the present invention presented herein clearly demonstrate that DRAMs of the present invention are capable of simplifying system structures and hence are extremely useful.

What is claimed is:

1. A dynamic random-access memory comprising
   a logical circuit which receives from an external system an address signal with a plural N-number of binary digits, examines only an n-number of specified digits out of said N binary digits of said received address signal where n is smaller than N and makes a determination only from said n specified digits of said received address signal whether or not said external system is accessing said memory,
   an address counter for refresh, and
   means for selecting on the basis of said determination by said logical circuit either an address from said external system if said logical circuit determines that said external system is accessing said memory or an address from said address counter if said logical circuit determines that said external system is not accessing said memory.

2. The memory of claim 1 further comprising
   a memory cell array,
   a row address decoder for selecting a row address in said array, and
   a column address decoder for selecting a column address in said array,
   said selecting means being a multiplexer for providing address signals by time division.

3. The memory of claim 1 wherein said logical circuit, said address counter and said selecting means are contained in said memory as parts thereof.

4. The memory of claim 1 wherein said specified digits are the highest n digits of said N digits.

5. The memory of claim 1 wherein said binary digits represent an address.

* * * * *